United States Patent
Kawasaki

(10) Patent No.: US 11,881,843 B2
(45) Date of Patent: *Jan. 23, 2024

(54) FILTER DEVICE AND DUPLEXER

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 259 days.

This patent is subject to a terminal disclaimer.

(21) Appl. No.: 17/095,782

(22) Filed: Nov. 12, 2020

(65) Prior Publication Data

US 2021/0067141 A1 Mar. 4, 2021

Related U.S. Application Data

(63) Continuation of application No. 16/814,047, filed on Mar. 10, 2020, now Pat. No. 10,868,517, which is a continuation of application No. 16/049,859, filed on Jul. 31, 2018, now Pat. No. 10,622,968, which is a continuation of application No. 15/452,825, filed on Mar. 8, 2017, now Pat. No. 10,063,213, which is a continuation of application No. 14/630,845, filed on Feb. 25, 2015, now Pat. No. 9,628,049, which is a (Continued)

(30) Foreign Application Priority Data

Aug. 30, 2012 (JP) .................................. 2012-189543

(51) Int. Cl.
H03H 9/64 (2006.01)
H03H 9/145 (2006.01)
H03H 9/72 (2006.01)
H03H 9/205 (2006.01)

(52) U.S. Cl.
CPC ...... H03H 9/6489 (2013.01); H03H 9/14547 (2013.01); H03H 9/14552 (2013.01); H03H 9/14558 (2013.01); H03H 9/205 (2013.01); H03H 9/6483 (2013.01); H03H 9/725 (2013.01)

(58) Field of Classification Search
CPC ............. H03H 9/6489; H03H 9/14547; H03H 9/14552; H03H 9/14558; H03H 9/205; H03H 9/6483; H03H 9/725
USPC ......................................... 333/133, 193–196
See application file for complete search history.

(56) References Cited

U.S. PATENT DOCUMENTS 3,582,838 A * 6/1971 DeVries ............. H03H 9/14561
333/194
9,628,049 B2 * 4/2017 Kawasaki .............. H03H 9/205
(Continued)

OTHER PUBLICATIONS

Kawasaki, "Filter Device and Duplexer", U.S. Appl. No. 16/814,047, filed Mar. 10, 2020.

Primary Examiner — Rakesh B Patel
Assistant Examiner — Jorge L Salazar, Jr.
(74) Attorney, Agent, or Firm — Keating & Bennett, LLP

(57) ABSTRACT

In a filter device, a transversal elastic wave filter, which defines a delay element, is connected in parallel with a band pass filter. The transversal elastic wave filter has the same amplitude characteristic as and the opposite phase to the band pass filter at a desired frequency inside an attenuation range of the band pass filter. When a wavelength determined by an electrode finger period of IDTs and is denoted by λ, the distance between the first IDT and the second IDT of the elastic wave filter is about 12λ or less.

9 Claims, 10 Drawing Sheets

Related U.S. Application Data continuation of application No. PCT/JP2013/065584, filed on Jun. 5, 2013.

(56) References Cited

U.S. PATENT DOCUMENTS

| | | | | |
|---|---|---|---|---|
| 10,063,213 B2* | 8/2018 | Kawasaki | .......... | H03H 9/14558 |
| 10,622,968 B2* | 4/2020 | Kawasaki | .......... | H03H 9/14547 |
| 10,868,517 B2* | 12/2020 | Kawasaki | ............ | H03H 9/6489 |
| 2010/0188165 A1* | 7/2010 | Nakamura | ........... | H04B 1/0057 |
| | | | | 333/132 |

* cited by examiner

FILTER DEVICE AND DUPLEXER

BACKGROUND OF THE INVENTION

1. Field of the Invention

The present invention relates to a filter device in which a delay element is connected in parallel with a band pass filter and to a duplexer that includes the filter device.

2. Description of the Related Art

In the related art, a variety of band pass filters are used in mobile communication devices such as cellular phones. In cellular phones and so forth, the frequency width between the passbands of a plurality of channels has been becoming smaller. Therefore, an increase in the attenuation in the vicinities of the passbands has been strongly demanded.

In Japanese Unexamined Patent Application Publication No. 62-261211, a filter device is disclosed in which a delay element is connected in parallel with a main filter. The delay element has a characteristic that it has substantially the same amplitude characteristic but a phase that differs by $(2n-1)\pi$ (n is a positive integer) at a desired frequency inside an attenuation range of the main filter. Therefore, direct waves at the desired frequency cancel each other out and attenuation can be increased at that frequency.

In Japanese Unexamined Patent Application Publication No. 62-261211, the delay element is formed by a surface acoustic wave (SAW) filter of a transversal type, for example.

However, in the filter device described in Japanese Unexamined Patent Application Publication No. 62-261211, there is a problem in that the frequency range of desired frequencies at which attenuation is desired to be increased is narrow.

SUMMARY OF THE INVENTION

Preferred embodiments of the present invention provide a filter device that is capable of widening a frequency range across which attenuation is desired to be increased outside of a passband and to provide a duplexer that includes the filter device.

A filter device according to a preferred embodiment of the present invention includes a band pass filter; and a delay element that is connected in parallel with the band pass filter and has a same amplitude characteristic as and an opposite phase of the band pass filter at a desired frequency inside an attenuation range of the band pass filter. The delay element preferably includes a transversal elastic wave filter including a first IDT and a second IDT, and a distance between the first IDT and the second IDT is 12λ or less when a wavelength determined by an electrode finger period of the IDT is denoted by λ.

In a certain specific aspect of the filter device according to various preferred embodiments of the present invention, the transversal elastic wave filter is a transversal elastic wave filter including a slanted, or inclined finger interdigital transducer (IDT). In this case, the frequency range across which it is desired to increase attenuation is widened even more.

In another specific aspect of the filter device according to various preferred embodiments of the present invention, the delay element preferably includes a plurality of transversal elastic wave filters and an electrode finger pitch of at least one of the transversal elastic wave filters is different from an electrode finger pitch of the remaining transversal elastic wave filter. In this case, it is possible to increase the number of frequency bands across which attenuation is increased and it is possible to further increase the frequency range across which it is desired to increase attenuation.

In another specific aspect of the filter device according to various preferred embodiments of the present invention, the distance between the first IDT and the second IDT is preferably about 6λ or less. In this case, the frequency range across which it is desired to increase attenuation is widened even more.

A duplexer according to another preferred embodiment of the present invention, which includes a first terminal that is connected to an antenna, a transmission terminal and a reception terminal, includes a first filter unit that is connected between the first terminal and the transmission terminal or the reception terminal, and includes any one of the filter devices according to a preferred embodiment of the present invention; and a second filter unit that is connected between the first terminal and the reception terminal or the transmission terminal and has a different passband to the first filter unit.

According to a filter device of a preferred embodiment of the present invention, the distance between IDTs in a delay element including a transversal elastic wave filter is preferably about 12λ or less and therefore attenuation at a desired frequency inside an attenuation range is increased and the frequency range across which it is possible to increase attenuation is effectively widened.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
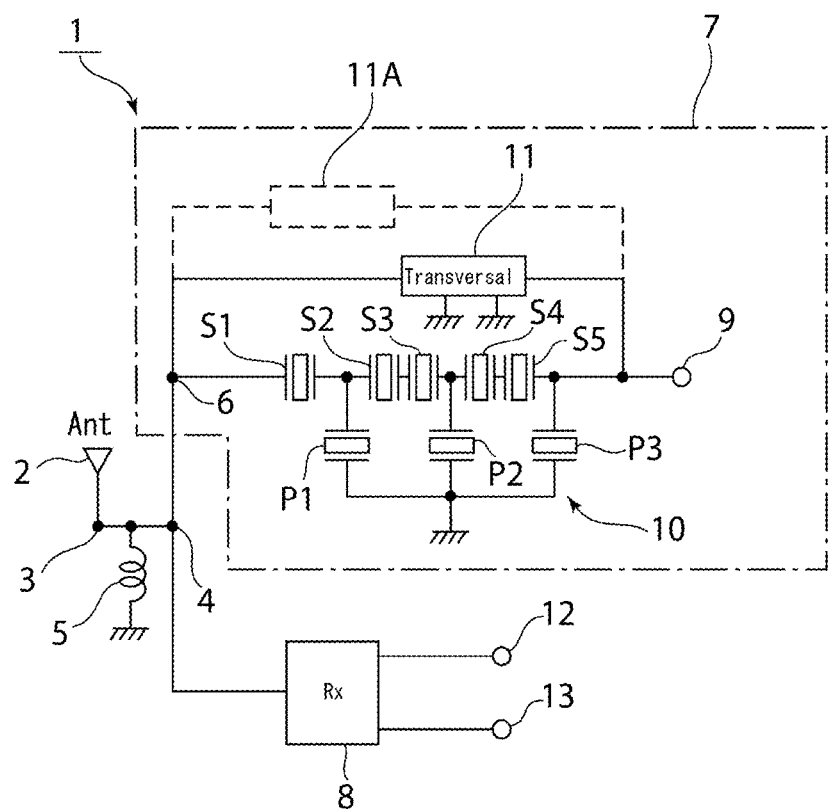
FIG. 1A is a schematic block diagram illustrating a duplexer according to a first preferred embodiment of the present invention.

Hereafter, the present invention will be made clearer by describing specific preferred embodiments of the present invention while referring to the drawings.

Figure 18:
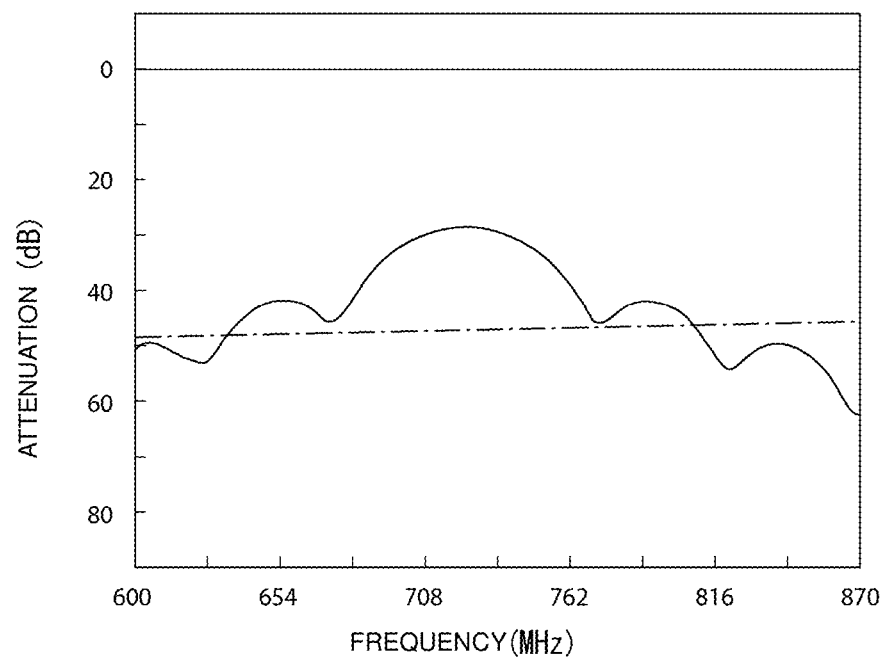
FIG. 18 illustrates amplitude characteristics of a transversal elastic wave filter and a capacitance of a band pass filter.
Figure 19:
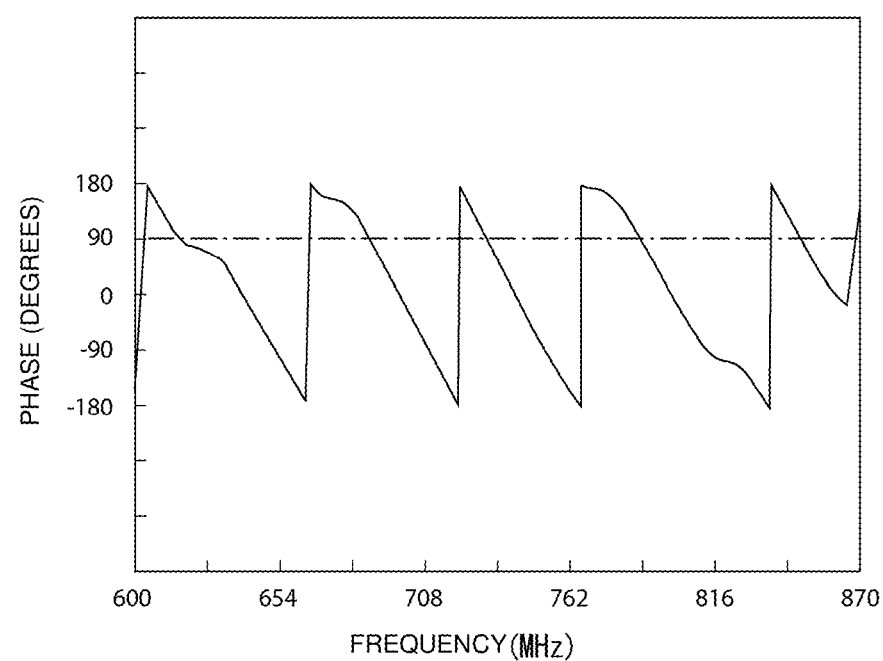
FIG. 19 illustrates phase characteristics of a transversal elastic wave filter and a capacitance of a band pass filter.

FIG. 18 and FIG. 19 are drawings for describing a problem with a filter device of the related art. FIG. 18 illustrates amplitude characteristics for a case where a band pass filter and a transversal surface acoustic wave filter, in which the distance between IDTs is 10.6λ, are connected in parallel with each other. FIG. 19 illustrates the phase characteristics. The alternate long and short dash lines in FIG. 18 and FIG. 19 respectively represent the attenuation and phase of a capacitance of the band pass filter.

As is clear from FIG. 18 and FIG. 19, the frequency interval across which the phase characteristic of the band pass filter, that is, the capacitance of the band pass filter and the phase characteristic of the transversal elastic wave filter have opposite phases to each other is very narrow. In FIG. 19, the frequency at which the phase of the capacitance is around 90° and the phase of the transversal elastic wave filter becomes the opposite phase of −90° is 710 MHz. At this time, the frequency range across which the phase of the elastic wave filter is in the range of −90°±30° is 706 MHz to 714 MHz. That is, the frequency range is only 8 MHz. Here, transmission of a signal occurs due to a stray capacitance in an attenuation range of the band pass filter. If it is considered that the wavelength of a high-frequency signal that propagates due to a stray capacitance is several m to several cm at a frequency of several hundred MHz to several GHz and that the propagation distance of the high-frequency signal that propagates due to the stray capacitance is several μm to several mm, the wavelength of the high-frequency signal is sufficiently larger than the propagation distance of the signal that propagates due to the stray capacitance. Therefore, the change in phase with a change in frequency is very small. In contrast, the speed of sound in a transversal surface acoustic wave filter is as slow at around 3000 to 4000 m/s. If it is considered that the wavelength of a high-frequency signal that propagates as a surface acoustic wave is several μm at a frequency of several hundred MHz to several GHz and the propagation distance of the surface acoustic wave is equal to or less than the device size at most, then the propagation distance of the surface acoustic wave is several μm to several mm. Therefore, it cannot be said that the wavelength of the high-frequency signal is sufficiently larger than the propagation distance. Therefore, the change in phase with a change in frequency is large as described above. If the distance between the IDTs is increased, the change in phase with respect to frequency will become even larger. Therefore, if the distance between the IDTs is increased, it will be difficult to improve attenuation across a wide frequency range.

In contrast, in the preferred embodiments and modifications thereof of the present invention to be described below, it is possible to widen a frequency range across which attenuation is improved.

FIG. 1A is a schematic block diagram illustrating a duplexer according to a first preferred embodiment of the present invention. A duplexer 1 includes an antenna terminal 3 that is connected to an antenna 2. A common connection terminal 4 is connected to the antenna terminal 3. A matching inductor 5 is connected between the common connection terminal 4 and a ground potential. A transmission filter, which includes a filter device 7 of a preferred embodiment of the present invention, and a reception filter 8 are connected to the common connection terminal 4. The filter device 7 includes a signal terminal 6 and a transmission terminal 9. A transmission signal is input from the transmission terminal 9.

The filter device 7 includes a band pass filter 10, which includes a ladder filter including a plurality of series-arm resonators S1 to S5 and a plurality of parallel-arm resonators P1 to P3. A transversal surface acoustic wave filter is connected in parallel with the band pass filter 10 and serves as a delay element.

The reception filter 8 is connected to the common connection terminal 4. The reception filter 8 has reception terminals 12 and 13. The reception filter 8 is composed of a suitable band pass filter circuit such as a longitudinally coupled resonator-type elastic wave filter.

One of the unique characteristics of this preferred embodiment is that the distance between IDTs of the transversal surface acoustic wave filter 11 is small at about 12λ or less, for example, and the surface acoustic wave filter 11 preferably has the same amplitude as and the opposite phase to the band pass filter 10 at a desired frequency outside of the band of the band pass filter 10. Therefore, out-of-band attenuation is increased at the desired frequency and it is possible to widen a frequency range across which out-of-band attenuation is large.

Figure 1B:
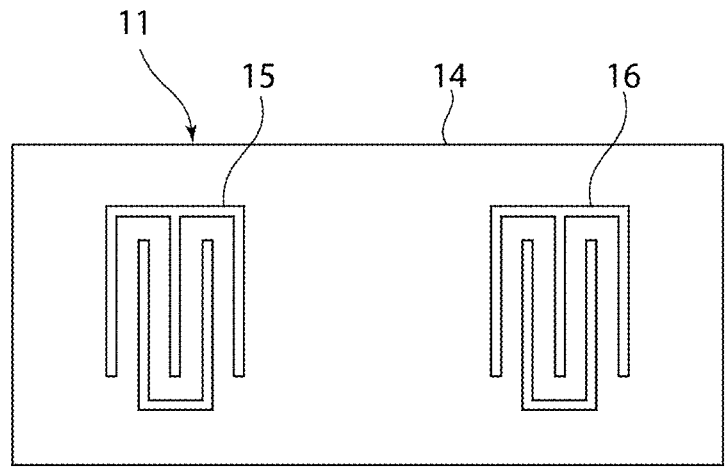
FIG. 1B is a schematic plan view of a transversal elastic wave filter used in the first preferred embodiment of the present invention.

As illustrated in FIG. 1B, the transversal surface acoustic wave filter 11 has a structure in which a first IDT 15 and a second IDT 16 are provided on a piezoelectric substrate 14. In the first preferred embodiment, the distance between IDTs, which is determined by a distance between the centers of electrode fingers, between the first IDT 15 and the second IDT is preferably small at about 12λ or less, for example. Therefore, the frequency range in which there is the relationship for the same amplitude and opposite phase is widened. This will be described with reference to FIG. 2 to FIG. 9.

The above-mentioned ladder filter, which includes surface acoustic wave resonators, was used in the band pass filter 10 when forming the duplexer 1. A surface acoustic wave filter was also used for the reception filter 8. A piezoelectric substrate composed of 42° Y cut X propagation LiTaO$_3$ was used as the piezoelectric substrate 14. The band pass filter 10 and the reception filter 8 having the above-described circuit configurations were provided on the piezoelectric substrate 14.

The first IDT 15 and the second IDT 16 were provided on the piezoelectric substrate 14 to define the surface acoustic wave filter 11.

The surface acoustic wave filter 11 had the following configuration.

The number of pairs of electrode fingers of the first IDT 15 was 3, the number of pairs of electrode fingers of the second IDT 16 was 15, the intersecting width in the first IDT 15 and the second IDT 16 was about 60 μm and the wavelength λ determined by the electrode finger period was about 5.5 μm, for example. The distance between the first IDT 15 and the second IDT 16 was about 0.5λ, for example.

Figure 2:
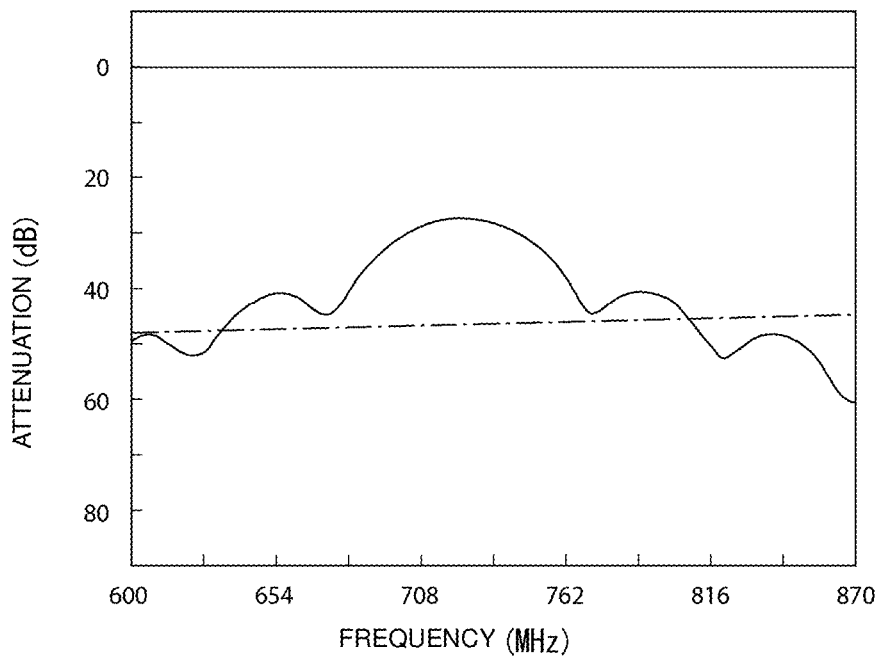
FIG. 2 illustrates an amplitude characteristic of the transversal elastic wave filter used in the first preferred embodiment of the present invention and an amplitude characteristic of a capacitance of a band pass filter.
Figure 3:
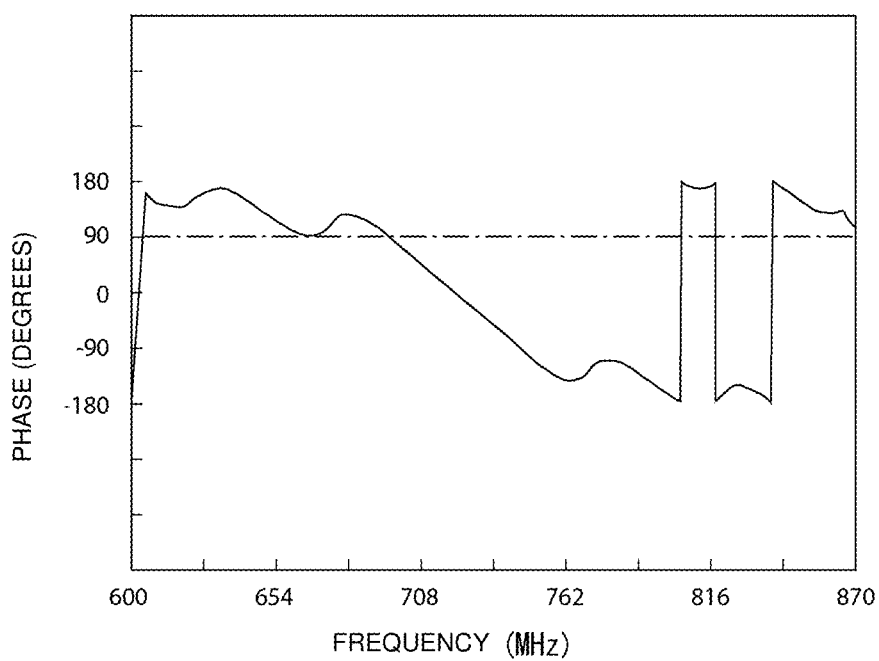
FIG. 3 illustrates a phase characteristic of the transversal elastic wave filter used in the first preferred embodiment of the present invention and a phase characteristic of the capacitance of the band pass filter.

The solid line in FIG. 2 represents an amplitude characteristic of the surface acoustic wave filter 11 and the solid line in FIG. 3 represents a phase characteristic of the surface acoustic wave filter 11. In addition, the alternate long and short dash lines in FIG. 2 and FIG. 3 respectively represent the amplitude characteristic and the phase characteristic of a capacitance of about 0.001 pF representing the band pass filter 10.

As is clear from comparing FIG. 2 and FIG. 3 and FIG. and FIG. 19, the frequency range across which the phase characteristic of the capacitance of the band pass filter 10 and the phase characteristic of the surface acoustic wave filter 11 have opposite phases to each other is wider than in the case of the amplitude characteristics and the phase characteristics illustrated in FIG. 18 and FIG. 19. For example, in FIG. 3, the frequency at which the surface acoustic wave filter 11 has the opposite phase to the capacitance of the band pass filter 10, that is, has a phase of about −90° is about 744 MHz. Then, for example, the frequencies at which the phase of the surface acoustic wave filter 11 is about −90°±30° are about 736 MHz to about 753 MHz and therefore the frequency range is about 17 MHz. In other words, the phase of the surface acoustic wave filter 11 is about −90°±30° across a frequency range that is over two times the width of the frequency range of about 8 MHz in the case of the configuration illustrated in FIG. 18. Therefore, it is clear that the frequency range across which the amplitudes are the same and the phases are opposite are widened.

The reason for this is as follows. In this preferred embodiment, the interval between the first IDT 15 and the second IDT 16 preferably is set to be small at about 0.5λ, for example. Consequently, the change in phase with frequency of the surface acoustic wave filter 11 is small. Therefore, the phase characteristic of the band pass filter 10 and the phase characteristic of the surface acoustic wave filter 11 are maintained in a state of having close to opposite phases across a wide frequency range. Therefore, according to this preferred embodiment, attenuation is increased across a wide frequency range.

In addition, in various preferred embodiments of the present invention, it is assumed that the meaning of "same amplitudes" includes not only the case where the amplitude of the band pass filter and the amplitude of the elastic wave filter are the same as each other, but also includes a case where an amplitude X of the elastic wave filter and an amplitude Y of the band pass filter when the band pass filter is connected to the elastic wave filter are within a range of about $10 \log_{10} X/Y = -5$ dB to +3 dB for the amplitudes of the signals of the two filters, for example. As described in Japanese Unexamined Patent Application Publication No. 62-261211, it is possible to increase the attenuation in a state where the amplitudes are the same as provided by various preferred embodiments of the present invention. Therefore, not limited to the case in which the amplitude of a signal of the band pass filter 10 and the amplitude of a signal of the surface acoustic wave filter 11 are equal to each other, it is sufficient that the amplitudes of the signals be within the same amplitude range described above which includes the case where the amplitudes of the signals are equal to each other.

In addition, "opposite phases" is not limited to just the case where the phase of the band pass filter 10 and the phase of the surface acoustic wave filter 11 are completely opposite to each other. That is, it is sufficient that the difference between the phase of the band pass filter 10 and the phase of the surface acoustic wave filter 11 be with a range of about 180°±30°, for example.

Figure 4:
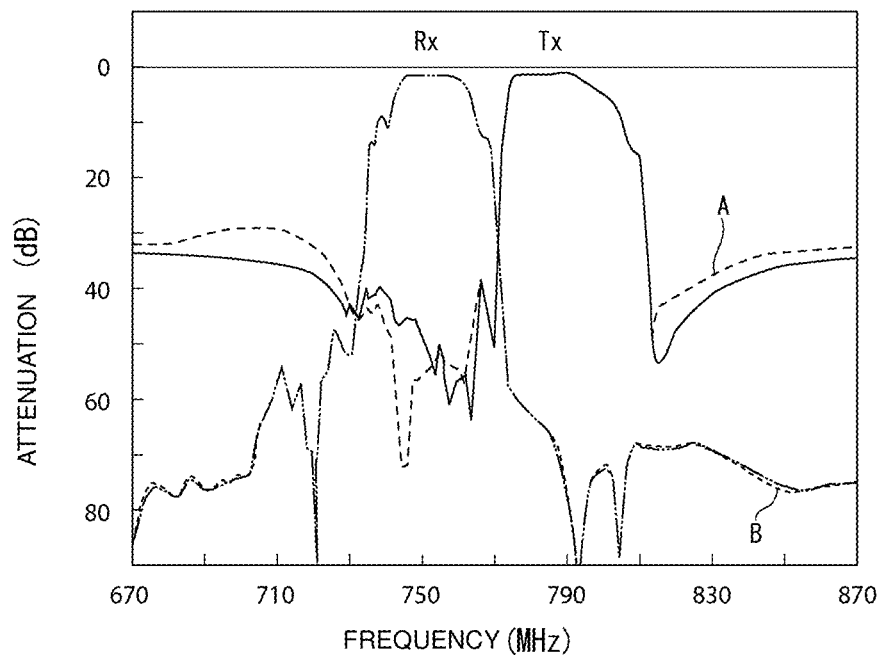
FIG. 4 illustrates a transmission characteristic and a reception characteristic of the duplexer of the first preferred embodiment of the present invention and illustrates a transmission characteristic and a reception characteristic of a duplexer of a comparative example in which a delay element is not connected.
Figure 5:
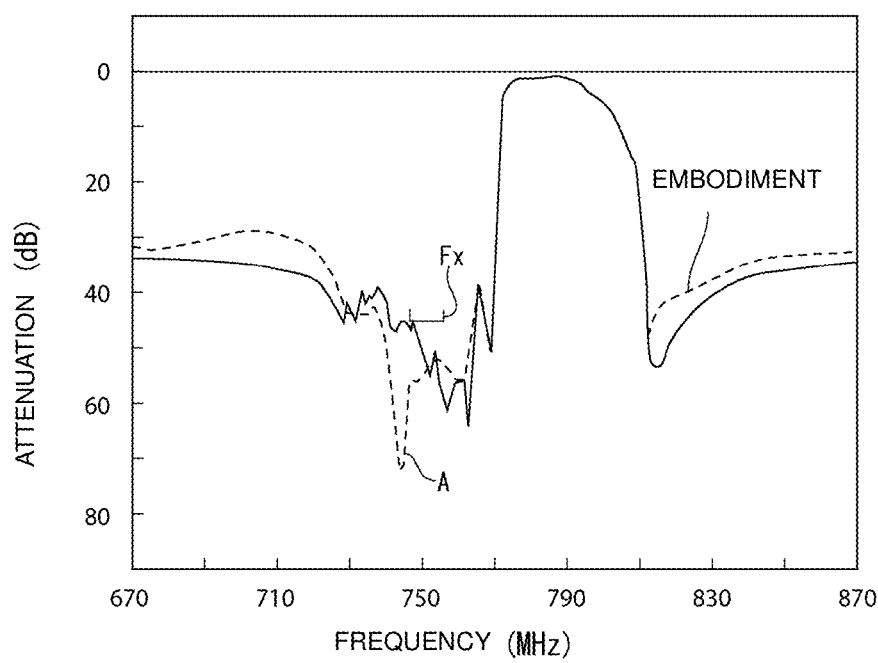
FIG. 5 illustrates the transmission characteristic of the duplexer of the first preferred embodiment of the present invention and the transmission characteristic of the duplexer of the comparative example.
Figure 6:
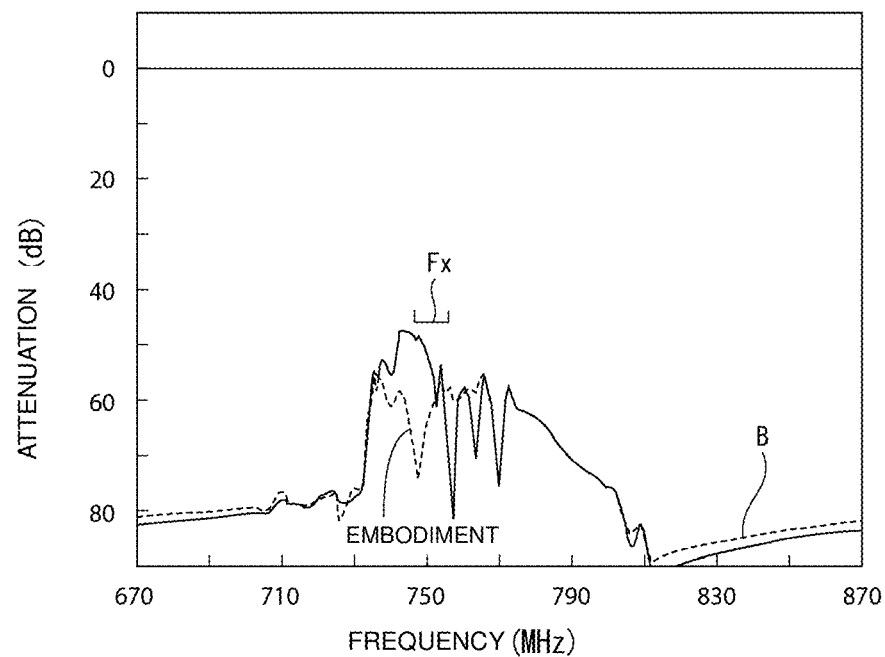
FIG. 6 illustrates the reception characteristic of the duplexer of the first preferred embodiment of the present invention and the reception characteristic of the duplexer of the comparative example.

The broken line A and the broken line B in FIG. 4 respectively represent a transmission waveform Tx and a reception waveform Rx of the duplexer 1. In addition, the solid line and the two-dot chain line respectively represent a transmission waveform and a reception waveform of a duplexer in which the surface acoustic wave filter 11 is not connected. FIG. 5 illustrates the transmission waveform of the duplexer and the transmission waveform of the comparative example extracted from FIG. 4. FIG. 6 illustrates the isolation characteristic of the duplexer and the isolation characteristic of the comparative example extracted from FIG. 4. In FIG. 5 and FIG. 6, the broken lines A and B illustrate the results of a preferred embodiment of the present invention and the solid lines illustrate the results of the comparative example.

According to the present preferred embodiment of the present invention, it is clear that attenuation of the transmission filter is improved in the reception band Fx in FIG. 5 and FIG. 6. That is, it is clear that an increase in attenuation of around 8 dB is achieved in the range of about 746 MHz to about 756 MHz, which is the reception band Fx, in the transmission waveform represented by the broken line A, compared with the transmission waveform represented by the solid line.

In addition, it is clear from FIG. 6 that also in the isolation waveform, an increase in isolation attenuation in the reception band Fx is achieved if the reception waveform of the present preferred embodiment represented by the broken line B and the reception waveform of the comparative example represented by the solid line are compared. Specifically, it is clear that an increase of around 10 dB is achieved in the isolation attenuation illustrated in FIG. 6 at a frequency of about 746 MHz, which is at the low side of the reception band Fx.

As described above, in this preferred embodiment, since the inter-IDT distance between the first IDT and the second IDT preferably is narrowed to about 0.5λ, attenuation is effectively increased in the reception band Fx.

Figure 7:
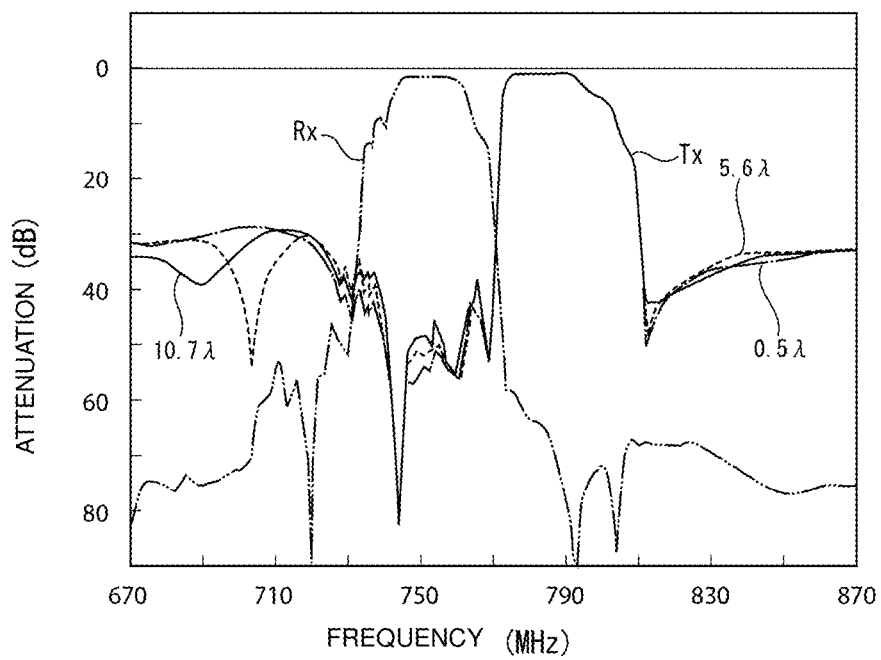
FIG. 7 illustrates transmission waveforms and reception waveforms when the distance between IDTs of the transversal elastic wave filter in the first preferred embodiment of the present invention is preferably set to be approximately 0.5λ, 5.6λ and 10.7λ.
Figure 8:
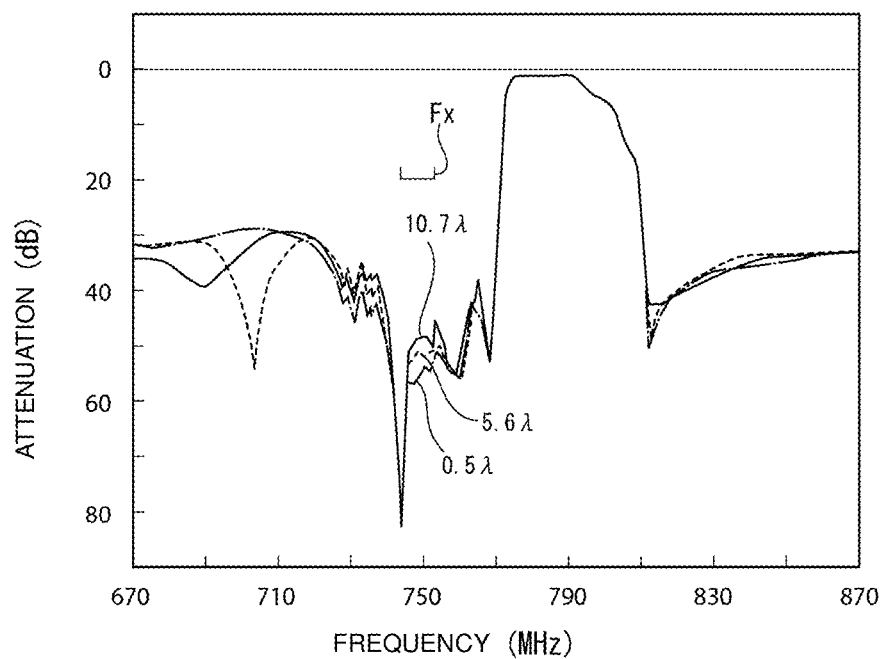
FIG. 8 illustrates transmission waveforms when the distance between IDTs of the transversal elastic wave filter in the first preferred embodiment of the present invention is preferably set to be approximately 0.5λ, 5.6λ and 10.7λ.
Figure 9:
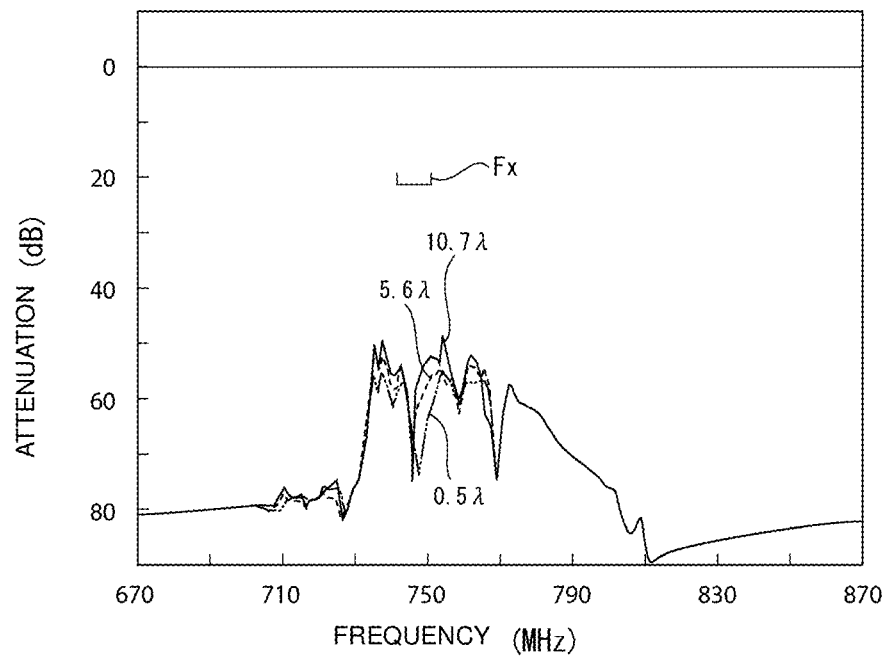
FIG. 9 illustrates reception waveforms when the distance between IDTs of the transversal elastic wave filter in the first preferred embodiment of the present invention is preferably set to be approximately 0.5λ, 5.6λ and 10.7λ.

FIGS. 7 to 9 illustrate the characteristics when the distance between the IDTs is about 0.5λ as described above in this preferred embodiment, and when it is about 5.6λ and about 10.7λ, for example. In FIG. 7, the transmission waveforms Tx and the reception waveforms Rx are superposed on one another and FIG. 8 illustrates the transmission waveforms and FIG. 9 illustrates the isolation waveforms.

As is clear from FIG. 8, attenuation is more effectively increased in the reception band Fx when the distance between IDTs is about 0.5λ, for example. In addition, when the distance between IDTs is about 10.7λ, the frequency range across which the attenuation in the reception band Fx is improved by about 3 dB or more is about 746 MHz to about 748 MHz, which is about 2 MHz, for example. When the distance between IDTs is about 0.5λ, the frequency range across which the attenuation in the reception band Fx is improved by about 3 dB or more is about 746 MHz to about 750.5 MHz, which is about 4.5 MHz, for example. Therefore, compared with the above-described comparative example, it is clear that the frequency range across which attenuation is capable of being increased is widened.

Figure 10:
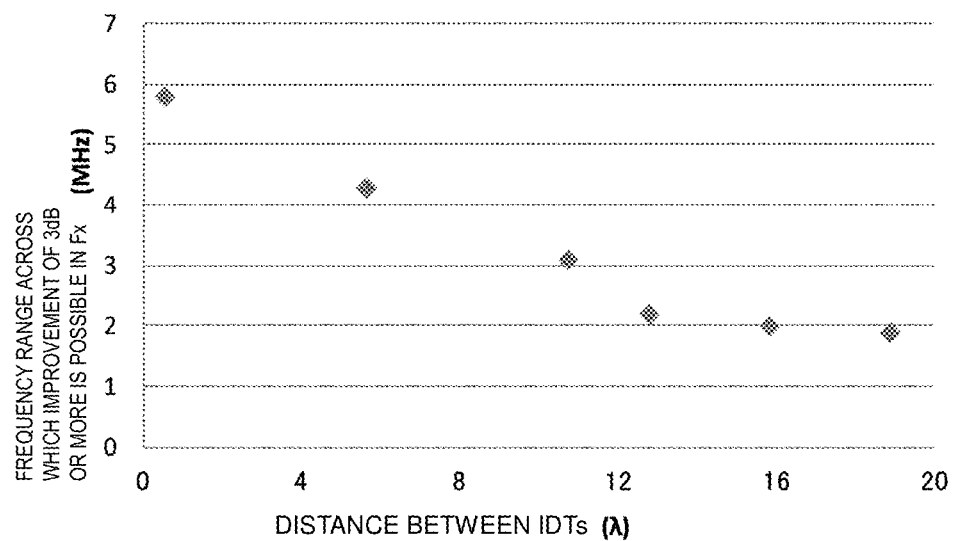
FIG. 10 illustrates the relationship between the distance between IDTs and a frequency range across which out-of-band attenuation is increased.

FIG. 10 illustrates the relationship between the frequency range across which attenuation in the vicinity of the attenuation band Fx in the above-described first preferred embodiment is improved by about 3 dB or more over the case that is not the present preferred embodiment and the distance between the IDTs when the distance between the IDTs is changed.

From FIG. 10, it is clear that, when the distance between the IDTs is larger than about 12λ, the frequency band across which attenuation can be improved by about 3 dB or more over the case that is not the present preferred embodiment is narrow at around 2 MHz and substantially does not change, for example. In addition, when the distance between IDTs is about 12λ or less, the frequency band across which an improvement of about 3 dB or more is capable of being achieved is made wider than about 2 MHz. Therefore, it is clear that frequency band across which an improvement is capable of being made is made wider as the distance between IDTs is reduced.

As is clear from FIG. 10, when the distance between IDTs is about 12λ or less, according to a preferred embodiment of the present invention, the frequency range across which attenuation is capable of being increased is effectively widened. In addition, it is clear that, when the inter-IDT distance is preferably about 6λ or less, a frequency range across which attenuation is capable of being increased up to at least about 4 MHz is secured, and the frequency range across which attenuation is capable of being increased is more effectively widened. In the step of forming the IDTs on the piezoelectric substrate, the distance between the IDTs is preferably about 0.25, or more in order to prevent interference between the IDTs.

Figure 11:
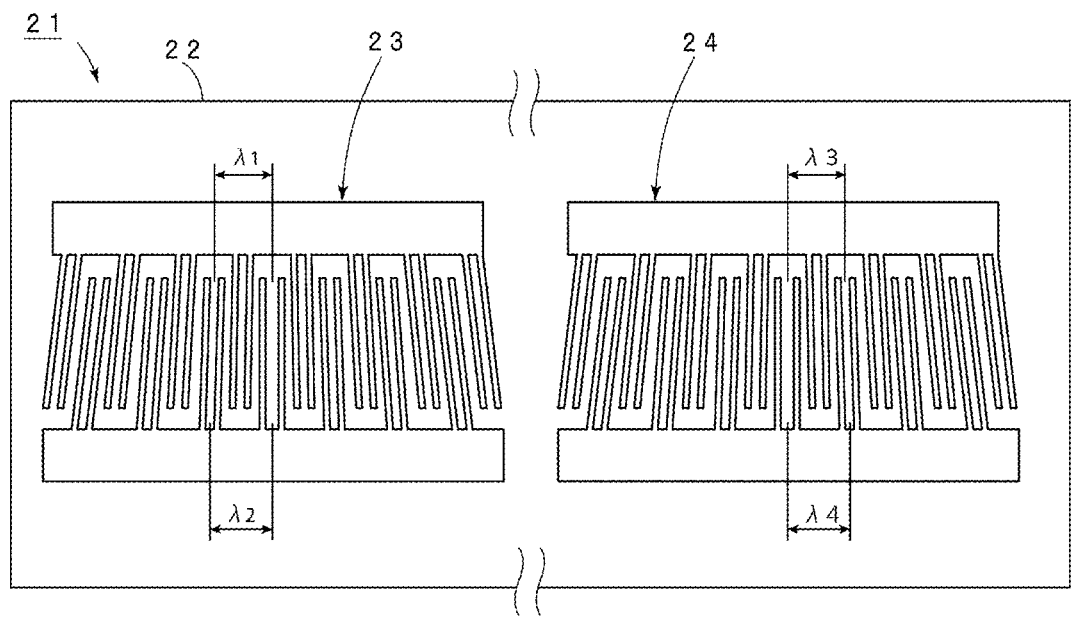
FIG. 11 is a plan view schematically illustrating the structure of a transversal elastic wave filter included in a second preferred embodiment of the present invention.

In a second preferred embodiment of the present invention, a surface acoustic wave filter 21 illustrated in FIG. 11 is preferably used instead of the surface acoustic wave filter 11 illustrated in FIG. 1B. The surface acoustic wave filter 21 is a transversal surface acoustic wave filter including IDTs having a slanted finger design.

As illustrated in FIG. 11, the surface acoustic wave filter 21 includes a piezoelectric substrate 22. A first IDT 23 and a second IDT 24 are provided on the piezoelectric substrate 22. The plurality of electrode fingers of the first IDT 23 extend in a slanted direction that intersects a direction perpendicular or substantially perpendicular to the propagation direction of the surface acoustic waves. The second IDT 24 is preferably configured in the same manner. An electrode finger interval of the first IDT 23 and the second IDT 24 from one side to the other side in the width direction of the piezoelectric substrate 22 is gradually changed. The passband is widened with such a slanted-finger surface acoustic wave filter 21.

Figure 12:
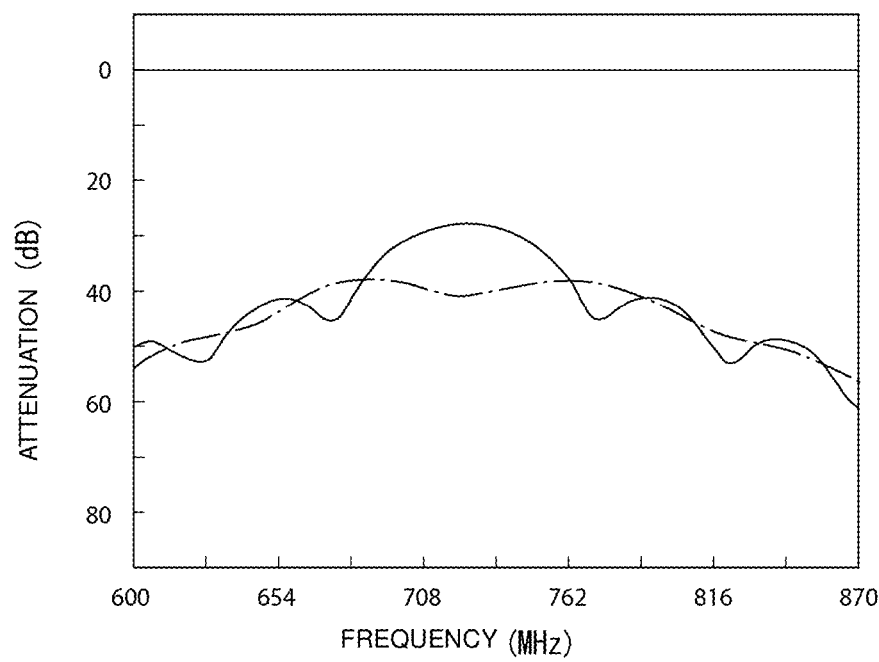
FIG. 12 illustrates an amplitude characteristic of the transversal elastic wave filter included in the first preferred embodiment of the present invention and an amplitude characteristic of the transversal elastic wave filter included in the second preferred embodiment of the present invention.
Figure 13:
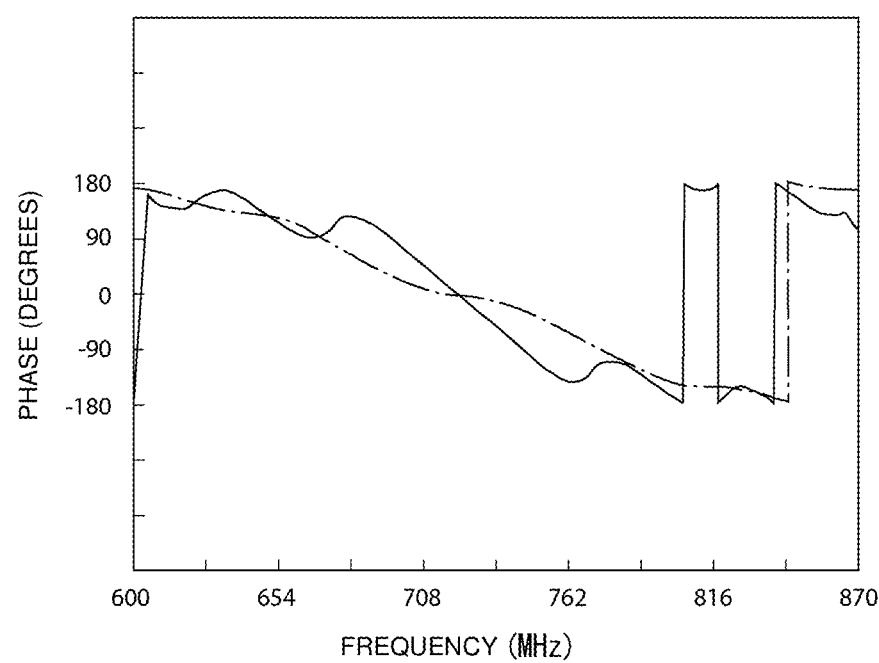
FIG. 13 illustrates a phase characteristic of the transversal elastic wave filter included in the first preferred embodiment of the present invention and a phase characteristic of the transversal elastic wave filter included in the second preferred embodiment of the present invention.

In FIG. 12 and FIG. 13, the solid lines respectively illustrate the amplitude characteristic and the phase characteristic of the surface acoustic wave filter 11 used in the first preferred embodiment and the alternate long and short dash lines respectively illustrate an amplitude characteristic and a phase characteristic of the slanted-finger surface acoustic wave filter 21. As is clear from FIG. 12 and FIG. 13, in the slanted-finger surface acoustic wave filter 21, the change in phase and the change in amplitude become smaller with a change in frequency. Therefore, by using the slanted-finger surface acoustic wave filter 21, the phase of the band pass filter 10 and a signal of the surface acoustic wave filter 21, which defines and serves as a delay element, are maintained in a state of having close to opposite phases and the same amplitudes across a wider frequency range. Therefore, the frequency range across which attenuation is capable of being increased is widened even more. A duplexer of the second preferred embodiment that uses the surface acoustic wave filter 21 was provided and its frequency characteristics were evaluated.

The configuration of the duplexer was the same as that of the first preferred embodiment except that the surface acoustic wave filter 21 was used. The specifications of the surface acoustic wave filter 21 were as follows.

Number of pairs of electrode fingers of first IDT 23=5, number of pairs of electrode fingers of second IDT 24=15. Electrode finger intersecting width=28 μm. Wavelength λ, which is the period of electrode fingers, =1.51 μm to 1.64 μm and IDT separation=1.3λ.

The slanted-finger transversal surface acoustic wave filter 21 was connected in parallel with a band pass filter 10 having a transmission frequency of around 777 MHz to 787 MHz and a ladder circuit configuration.

Figure 14:
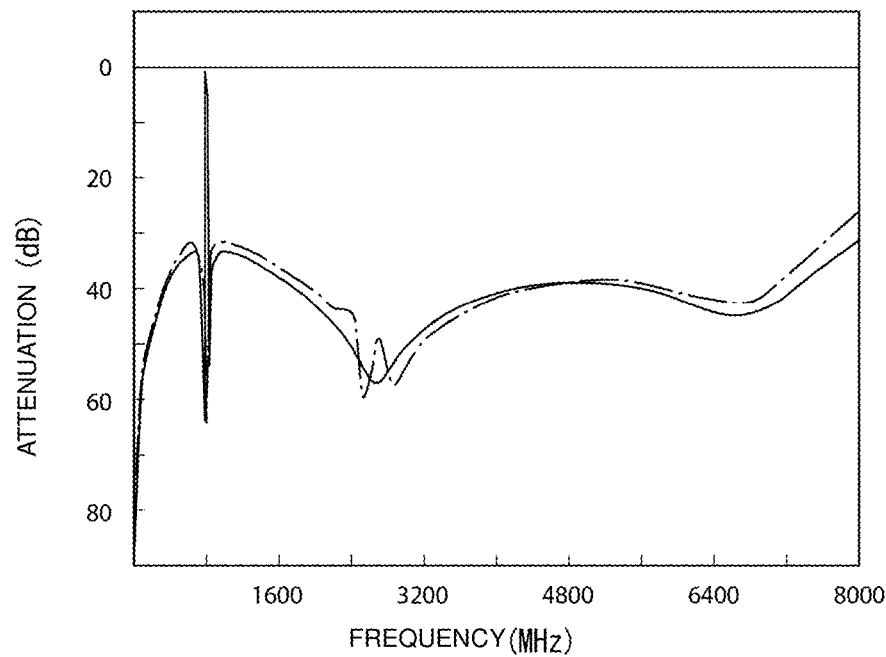
FIG. 14 illustrates an attenuation-frequency characteristic of a transmission filter of the duplexer of the second preferred embodiment of the present invention and an attenuation-frequency characteristic of a comparative example in which a transversal elastic wave filter is not connected.

The attenuation-frequency characteristic of the thus-configured filter device is represented by the alternate long and short dash line in FIG. 14. In addition, for comparison, an attenuation-frequency characteristic of the band pass filter when not connected to the surface acoustic wave filter 21 is represented by the solid line in FIG. 14. In addition, an important portion of FIG. 14 is illustrated in an enlarged manner in FIG. 15.

Figure 15:
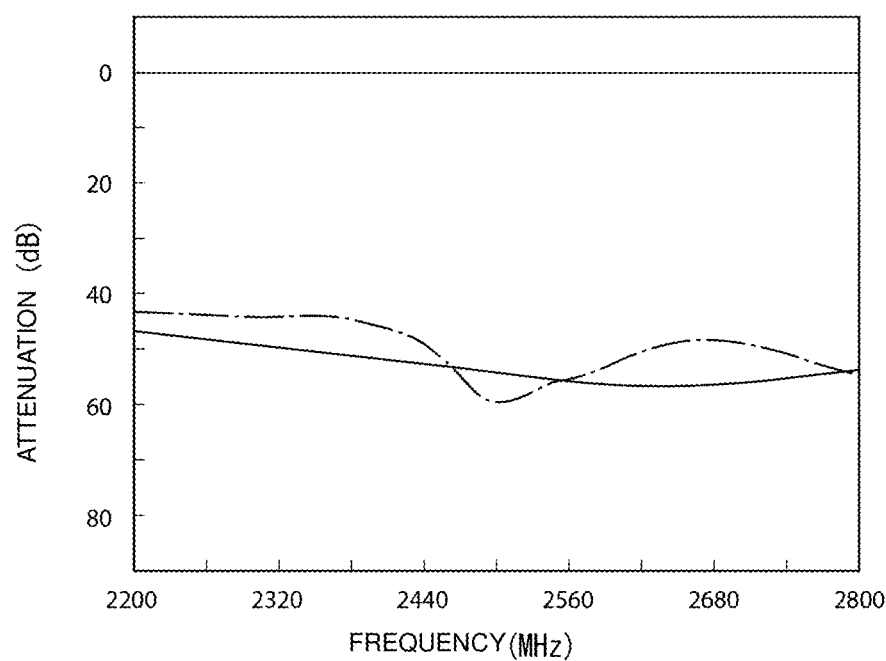
FIG. 15 is an enlarged view of an important portion of FIG. 14.

As is clear from FIG. 14 and FIG. 15, according to this preferred embodiment, attenuation is increased in the vicinity of about 2.5 GHz, which is a frequency range at a frequency higher than about 1200 MHz, which is the transmission frequency. More specifically, attenuation in the vicinity of about 2.5 GHz was around 53 dB in the case where the surface acoustic wave filter 21 was not connected, whereas it was possible to increase the attenuation to around 60 dB by connecting the surface acoustic wave filter 21, for example.

Figure 16:
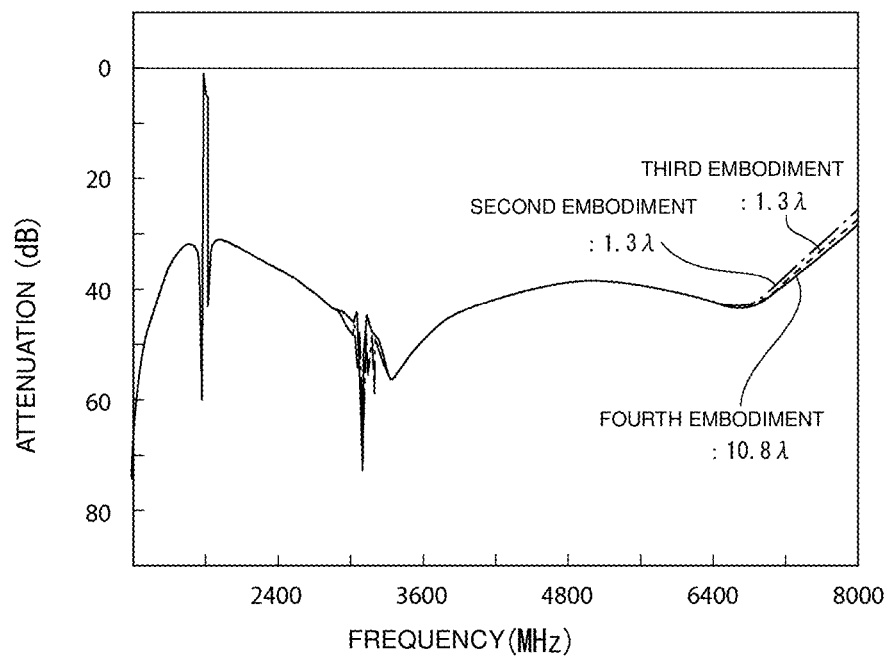
FIG. 16 illustrates at an enlarged scale transmission waveforms of the second preferred embodiment of the present invention when the distance between IDTs is about 1.3λ and of third and fourth preferred embodiments of the present invention in which a slanted structure is not provided and the distance between IDTs is about 1.3λ or about 10.8λ.
Figure 17:
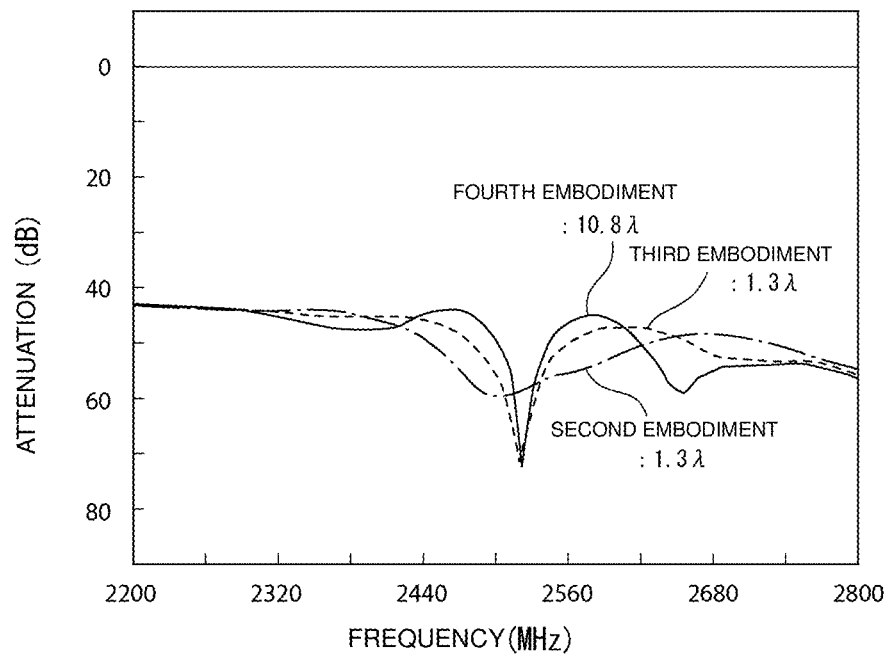
FIG. 17 illustrates at an enlarged scale transmission waveforms of the second preferred embodiment of the present invention when the distance between IDTs is about 1.3λ and of the third and fourth preferred embodiments of the present invention in which a slanted structure is not provided and the distance between IDTs is about 1.3λ or about 10.8λ.

In addition to the attenuation-frequency characteristics of the filter device of the second preferred embodiment of the present invention, attenuation-frequency characteristics of filter devices of third and fourth preferred embodiments of the present invention are illustrated in FIGS. 16 and 17. The third and fourth preferred embodiments of the present invention use the surface acoustic wave filter 11, which does not have a slanted finger structure, similarly to the first preferred embodiment of the present invention. In the third and fourth preferred embodiments of the present invention, the distances between the IDTs in the surface acoustic wave filters are respectively about 1.3λ and about 10.8λ, for example. In other respects, the configurations are preferably the same or substantially the same as that of the elastic wave filter of the second preferred embodiment of the present invention.

As is clear from FIG. 16 and FIG. 17, the maximum value of attenuation in the vicinity of about 2.5 GHz is increased in the third and fourth preferred embodiments compared with the second preferred embodiment of the present invention. However, it is clear that the frequency range across which attenuation is increased is wider in the second preferred embodiment of the present invention. That is, as illustrated in FIG. 15, in the second preferred embodiment of the present invention, the frequency range across which attenuation is capable of being increased over the attenuation in the vicinity of about 2.5 GHz in the case where there is only the band pass filter 10 is about 95 MHz, for example. In contrast, in the third and fourth preferred embodiments of the present invention, the frequency ranges across which the attenuation is capable of being increased over the attenuation in the vicinity of about 2.5 GHz in the frequency characteristic of just the band pass filter 10 are about 45 MHz and about 25 MHz, respectively, for example. Therefore, according to the second preferred embodiment of the present invention, it is clear that the frequency range across which attenuation at a desired frequency outside of the band of the band pass filter 10 is capable of being increased is widened even more. This is because, as described above, the changes in amplitude and phase with changes in frequency are small in the slanted-finger surface acoustic wave filter 21.

In the above-described first to fourth preferred embodiments of the present invention, a single surface acoustic wave filter 11 is connected to the band pass filter 10. In various preferred embodiments of the present invention, a plurality of delay elements may be connected in parallel with the band pass filter 10. That is, as illustrated by the broken line in FIG. 1, a second transversal surface acoustic wave filter 11A may be connected in parallel with the band pass filter 10. In this case, it is preferable that the electrode finger pitch of the surface acoustic wave filter 11 and the electrode finger pitch of the surface acoustic wave filter 11A be different from each other. In this way, attenuation is increased in a plurality of frequency bands.

In the above-described preferred embodiments of the present invention, a surface acoustic wave filter is preferably included as the elastic wave filter that defines the delay element, but a transversal boundary acoustic wave filter may be used instead. A filter on the input or the output or both sides may include another element such as an inductor and a capacitor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first terminal and a second terminal;
   a band pass filter including at least two series arm resonators and at least two parallel arm resonators connected between the first terminal and the second terminal; and
   a first acoustic wave filter that is connected in parallel with the band pass filter and between the first terminal and the second terminal; wherein
   the at least two parallel arm resonators includes a first parallel arm resonator and a second parallel arm resonator;
   the first parallel arm resonator is connected between a first node and a ground potential;
   the second parallel arm resonator is connected between a second node and the ground potential; and
   the two series arm resonators are connected in series directly between the first node and the second node.

2. The filter device according to claim 1, wherein the at least two series arm resonators and the at least two parallel arm resonators define a ladder filter.

3. The filter device according to claim 1, wherein the first acoustic wave filter is connected to the ground potential.

4. A duplexer comprising:
   the filter device according to claim 1;
   an antenna terminal;
   a common connection terminal connected to the antenna terminal; and
   a second band pass filter connected to the common connection terminal.

5. The duplexer according to claim 4, further comprising a matching inductor connected between the common connection terminal and the ground potential.

6. The filter device according to claim 1, wherein the first acoustic wave filter includes an IDT electrode including a plurality of electrode fingers extending in a slanted direction that intersects a direction perpendicular or substantially perpendicular to a propagation direction of surface acoustic waves.

7. A filter device comprising:
   a first terminal and a second terminal;
   a band pass filter including at least one series arm resonator and at least one parallel arm resonator connected between the first terminal and the second terminal;
   a first acoustic wave filter that is connected in parallel with the band pass filter and between the first terminal and the second terminal; and
   a second surface acoustic wave filter connected in parallel with the band pass filter and between the first terminal and the second terminal.

8. A filter device comprising:
   a first terminal and a second terminal;
   a band pass filter including at least one series arm resonator and at least one parallel arm resonator connected between the first terminal and the second terminal; and
   a first acoustic wave filter that is connected in parallel with the band pass filter and between the first terminal and the second terminal; wherein
   the first acoustic wave filter is a transversal elastic wave filter.

9. A filter device comprising:
a first terminal and a second terminal;
a band pass filter including at least one series arm resonator and at least one parallel arm resonator connected between the first terminal and the second terminal; and
a first acoustic wave filter that is connected in parallel with the band pass filter and between the first terminal and the second terminal; wherein
the first acoustic wave filter is a transversal surface acoustic wave filter including IDTs having a slanted finger design.

* * * * *